(12) United States Patent
Mao et al.

(10) Patent No.: US 9,018,543 B2
(45) Date of Patent: Apr. 28, 2015

(54) ROTARY MECHANISM AND RELATED ELECTRONIC DEVICE

(71) Applicant: Wistron Corporation, New Taipei (TW)

(72) Inventors: Zhong-hui Mao, New Taipei (TW); Ru-Feng Wu, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 199 days.

(21) Appl. No.: 13/902,995

(22) Filed: May 28, 2013

(65) Prior Publication Data
US 2014/0167584 A1    Jun. 19, 2014

(30) Foreign Application Priority Data
Dec. 13, 2012    (CN) .................. 2012 2 0690503 U

(51) Int. Cl.
| H05K 7/14 | (2006.01) |
| A47B 49/00 | (2006.01) |
| H05K 5/02 | (2006.01) |

(52) U.S. Cl.
CPC .............. *H05K 5/0226* (2013.01); *Y10T 16/528* (2015.01)

(58) Field of Classification Search
CPC ... G06F 1/1681; G06F 1/1654; G06F 1/1679; E05D 7/10; E05D 7/12; E05D 2005/145; E05D 7/1055; E05D 7/1077; H05K 5/0226; H05K 5/0221

USPC .......... 361/679.27, 679.58; 16/231; 312/326; 174/543

See application file for complete search history.

(56) References Cited

U.S. PATENT DOCUMENTS

| 6,519,140 B1 * | 2/2003 | Kim et al. ................. 361/679.58 |
| 7,322,072 B2 | 1/2008 | Lin |
| 8,068,334 B2 * | 11/2011 | Tang .......................... 361/679.27 |
| 2006/0274058 A1 * | 12/2006 | Han ............................... 345/204 |

* cited by examiner

*Primary Examiner* — Hung S Bui
*Assistant Examiner* — James Wu
(74) *Attorney, Agent, or Firm* — Winston Hsu; Scott Margo

(57) ABSTRACT

A rotary mechanism includes an accommodating slot structure, a supporting arm, a pivoting portion and a resilient component. The accommodating slot structure is disposed on the bezel. The accommodating slot structure includes a pivot hole structure and an opening structure, respectively formed on the lateral surface and a bottom of the accommodating slot structure. The supporting arm is disposed on the door. The pivoting portion is disposed on the surface of the supporting arm. The pivoting portion is disposed inside the pivot hole structure, so that the supporting arm is rotatably disposed inside the accommodating slot structure. The resilient component is movably accommodated inside the opening structure. A first end of the resilient component is resiliently connected to the lateral surface of the accommodating slot structure. A second end of the resilient component points the surface of the supporting arm, to prevent the pivoting portion from separation.

18 Claims, 14 Drawing Sheets

ROTARY MECHANISM AND RELATED ELECTRONIC DEVICE

BACKGROUND OF THE INVENTION

1. Field of the Invention

The present invention relates to a rotary mechanism and a related electronic device, and more particularly, to a rotary mechanism and a related electronic device with easy operation and preferred structural strength.

2. Description of the Prior Art

A conventional computer host includes the casing and the decoration panel. A plurality of electronic components is disposed inside the casing. The electronic components are the processor, the motherboard, the memory module, the hard disk, the optical disk driver, the sound card, the graphics card, the network card and so on. Because the hard disk, the sound card, the graphics card and the network card can be detachable according to user's demand, so a plurality of holes is formed on a surface of the decoration panel to partly expose the detachable electronic components for convenient repair. However, appearance of the conventional computer host that exposes the electronic components is inartistic and unsafe, such as drawbacks of current leakage, so the sheltering door is utilized to movably cover the decoration panel to improve the appearance and safety of the product. Thus, design of a pivot mechanism disposed between the decoration panel and the sheltering door to provide convenient rotation and preferred structural stability is an important issue in the related computer industry.

SUMMARY OF THE INVENTION

The present invention provides a rotary mechanism and a related electronic device with easy operation and preferred structural strength for solving above drawbacks.

According to the claimed invention, a rotary mechanism disposed between a door and a panel is disclosed. The rotary mechanism includes an accommodating slot structure, a supporting arm, a pivoting portion and a resilient component. The accommodating slot structure is disposed on the panel. The accommodating slot structure includes a first inner lateral wall, a second inner lateral wall and a bottom. The first inner lateral wall and the second inner lateral wall are opposite to each other. The accommodating slot structure includes a pivot hole structure and an opening structure. The pivot hole structure is formed on the first inner lateral wall. The opening structure is formed on the bottom and adjacent to the second inner lateral wall. The supporting arm is disposed on the door. The supporting arm includes a first surface and a second surface, and the first surface is opposite to the second surface. The pivoting portion is disposed on the first surface of the supporting arm. The pivoting portion inserts into the pivot hole structure so that the supporting arm is rotatably disposed inside the accommodating slot structure. The resilient component is movably disposed inside the opening structure. A first end of the resilient component is connected to the second inner lateral wall in a resiliently bending manner. A second end of the resilient component relative to the first end points the second surface of the supporting arm to prevent separation of the pivoting portion and the pivot hole structure.

According to the claimed invention, a distance between the first inner lateral wall and the second end of the resilient component is substantially smaller than an amount of widths of the supporting arm and the pivoting portion.

According to the claimed invention, the rotary mechanism further includes a handle disposed on the second end of the resilient component and located at an outer surface of the resilient component.

According to the claimed invention, the resilient component stretches from the second inner lateral wall into the accommodating slot structure, and the outer surface of the resilient component is located between walls of the opening structure.

According to the claimed invention, a thickness of the handle is substantially smaller than a wall thickness of the opening structure.

According to the claimed invention, a gap is formed between the handle and a wall of the opening structure.

According to the claimed invention, the rotary mechanism further includes at least one rib connected between the supporting arm and the door. A planar normal vector of the rib is substantially parallel to a pivot direction of the pivoting portion.

According to the claimed invention, the pivoting portion is a solid structure or a hollow structure.

According to the claimed invention, the supporting arm includes a first part and a second part. Two ends of the first part are respectively connected to the door and the second part. A structural direction of the first part is different from a structural direction of the second part.

According to the claimed invention, the accommodating slot structure further includes a constraining wall. The second part of the supporting arm contacts against the bottom and the constraining wall to constrain rotation of the supporting arm relative to the accommodating slot structure.

According to the claimed invention, an electronic device includes a casing, a panel, a door and at least one rotary mechanism. An electronic component is disposed inside the casing. The panel is disposed on the casing. A hole is formed on the panel, and the electronic component is partly exposed via the hole. The door is rotatably disposed on the panel for covering the electronic component. The rotary mechanism is disposed between the door and the panel. The rotary mechanism includes an accommodating slot structure, a supporting arm, a pivoting portion and a resilient component. The accommodating slot structure is disposed on the panel. The accommodating slot structure includes a first inner lateral wall, a second inner lateral wall and a bottom. The first inner lateral wall and the second inner lateral wall are opposite to each other. The accommodating slot structure includes a pivot hole structure and an opening structure. The pivot hole structure is formed on the first inner lateral wall. The opening structure is formed on the bottom and adjacent to the second inner lateral wall. The supporting arm is disposed on the door. The supporting arm includes a first surface and a second surface, and the first surface is opposite to the second surface. The pivoting portion is disposed on the first surface of the supporting arm. The pivoting portion inserts into the pivot hole structure so that the supporting arm is rotatably disposed inside the accommodating slot structure. The resilient component is movably disposed inside the opening structure. A first end of the resilient component is connected to the second inner lateral wall in a resiliently bending manner. A second end of the resilient component relative to the first end points the second surface of the supporting arm to prevent separation of the pivoting portion and the pivot hole structure.

The rotary mechanism of the present invention has advantages of simple structure, easy manufacture and low cost. The resilient recovering force of the supporting arm and the resilient component can be utilized to rapidly assemble the door with the panel, and the resilient component further can prevent separation of the door and the panel. Disassembly of the door from the panel is tooless, and constraint of the rotary mechanism between the door and the panel can be released manually. The rotary mechanism of the present invention conforms to safety regulation of the consumer apparatus market, which is set according to material property of the rotary mechanism. Therefore, the electronic device with the rotary mechanism of the present invention has advantages of easy operation, artistic appearance and preferred structural strength.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
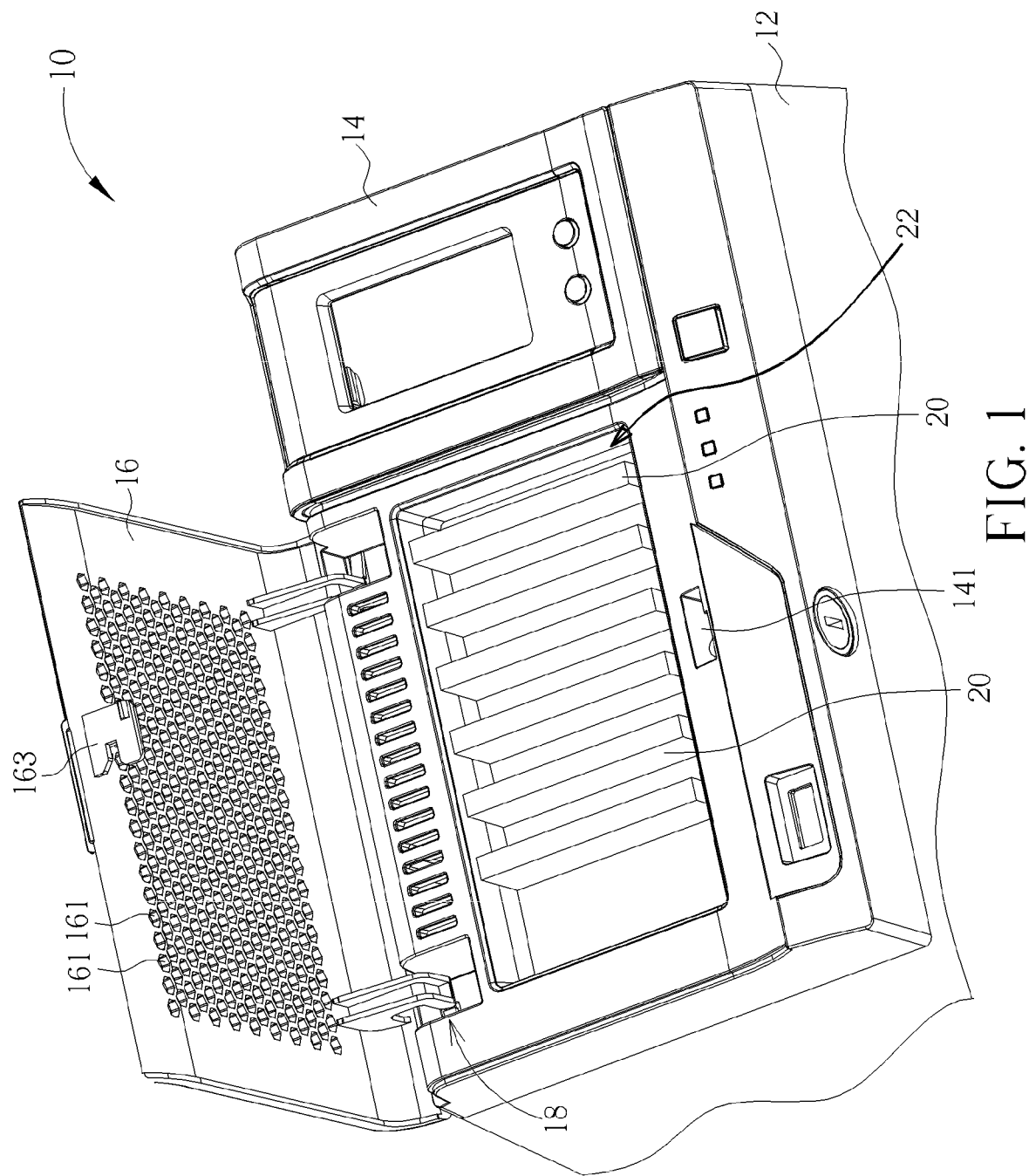
FIG. 1 is a diagram of an electronic device according to an embodiment of the present invention.

Please refer to FIG. 1. FIG. 1 is a diagram of an electronic device 10 according to an embodiment of the present invention. The electronic device 10 includes a casing 12, a panel 14, a door 16 and at least one rotary mechanism 18. A plurality of electronic components 20 can be disposed inside the casing 12. The electronic component 20 can be the hard disk, the optical disk driver, the sound card, the graphics card, the network card and so on. The panel 14 is disposed on the casing 12. A hole 22 is formed on the panel 22 to partly expose the electronic component 20 for detachment and convenient repair. For hiding the hole 22 on the panel 14, the door 16 is rotatably disposed on an edge of the panel 14. The door 16 can cover the panel 14 to shelter the electronic components 20, and the electronic components 20 are exposed when the door 16 is unfolded relative to the panel 14. Generally, the electronic device 10 preferably includes two rotary mechanisms 18 disposed on symmetrical positions between the panel 14 and the door 16. The door 16 can rotate relative to the panel 14 via the rotary mechanisms 18 stably and conveniently.

Figure 2:
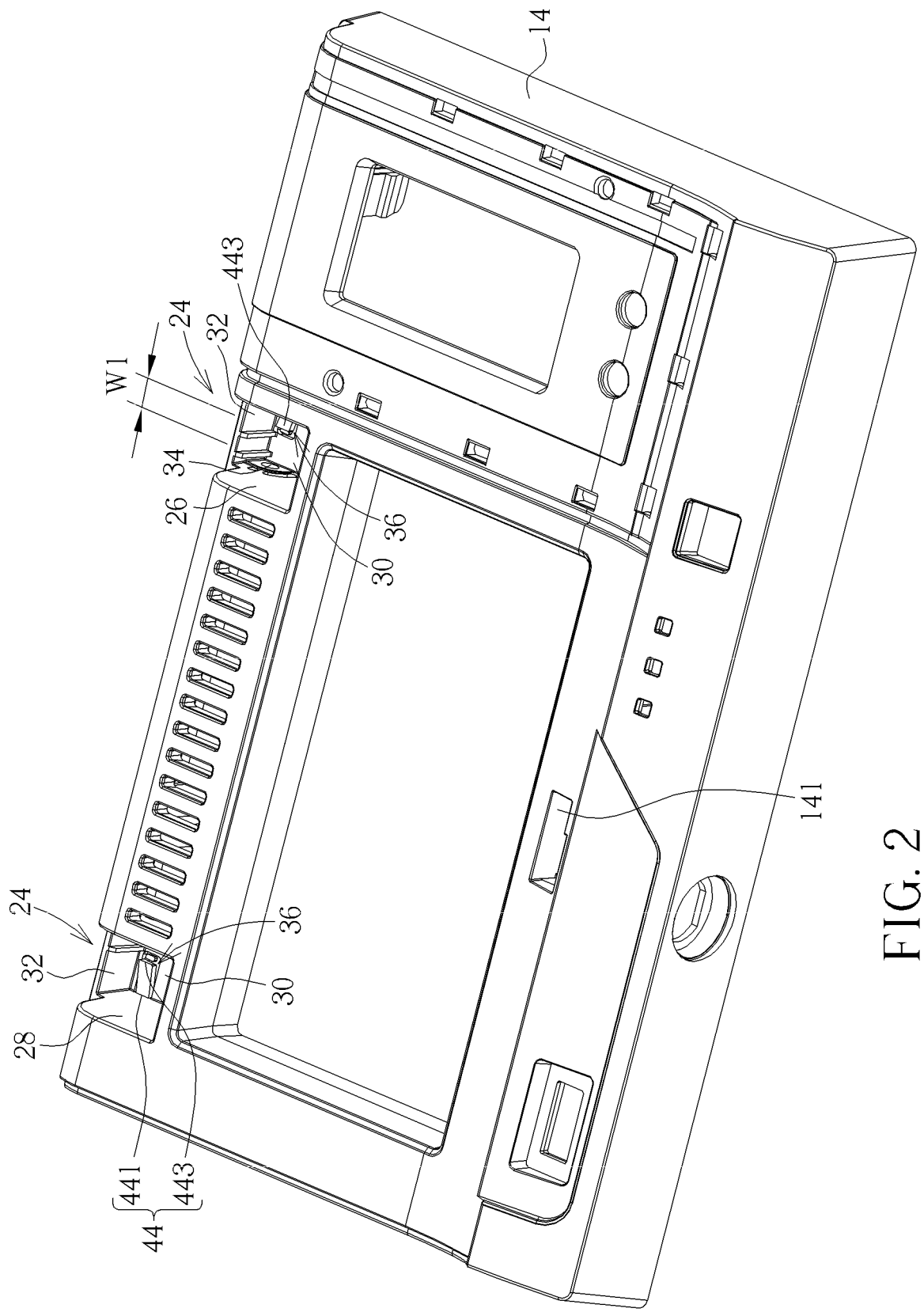
FIG. 2 and FIG. 3 respectively are diagrams of a panel in different views according to the embodiment of the present invention.
Figure 3:
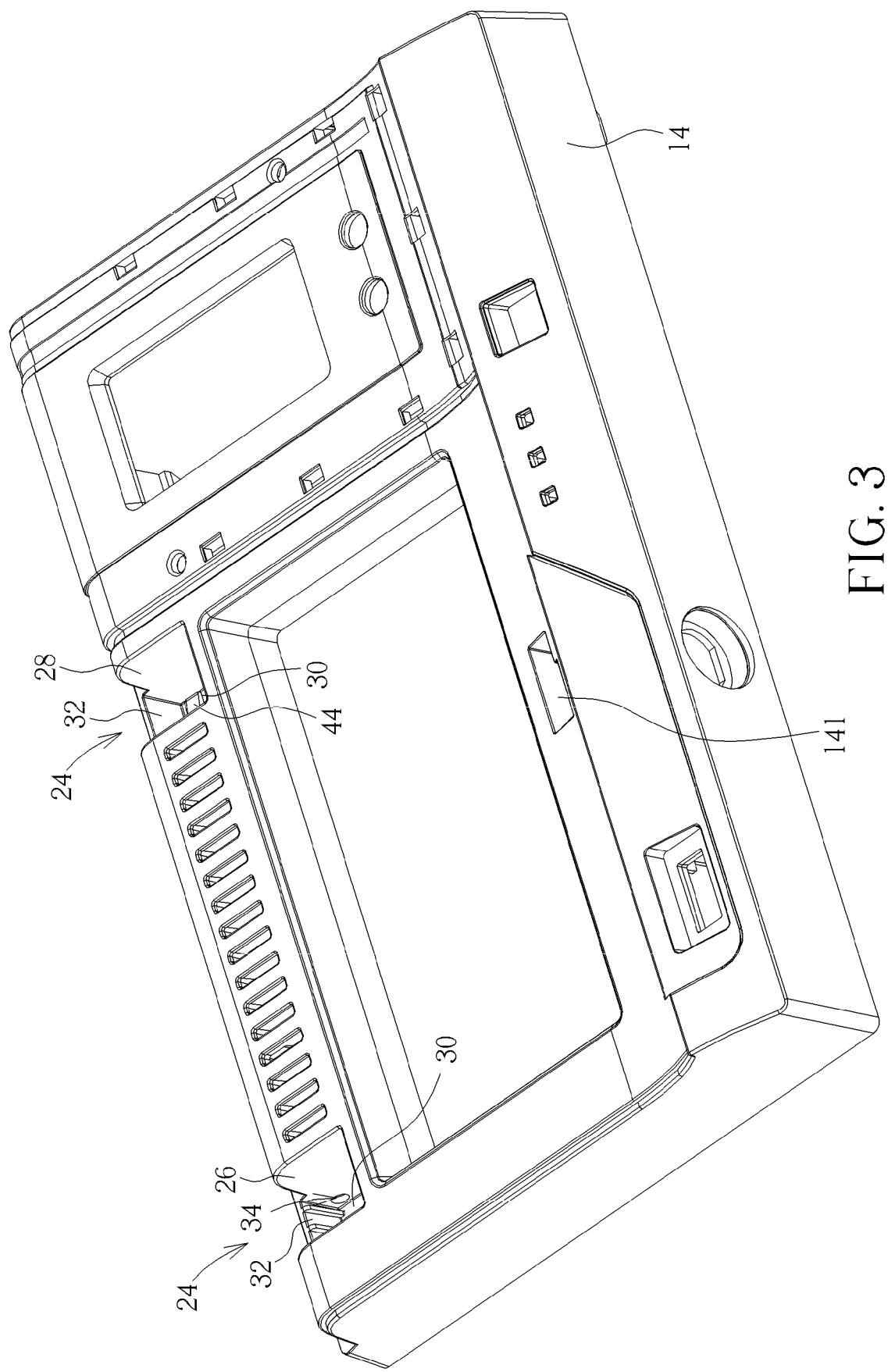

Please refer to FIG. 1 to FIG. 3. FIG. 2 and FIG. 3 respectively are diagrams of the panel 14 in different views according to the embodiment of the present invention. Each rotary mechanism 18 includes an accommodating slot structure 24 disposed on the panel 14. The accommodating slot structure 24 includes a first inner lateral wall 26, a second inner lateral wall 28, a bottom 30 and a constraining wall 32. The first inner lateral wall 26 is opposite to the second inner lateral wall 28. The first inner lateral wall 26, the second inner lateral wall 28 and the constraining wall 32 are respectively disposed on three edges of the bottom 30. The accommodating slot structure 24 includes a pivot hole structure 34 and an opening structure 36. The pivot hole structure 34 is formed on the first inner lateral wall 26. The opening structure 36 is formed on the bottom 30 and adjacent to the second inner lateral wall 28. The panel 14 can further include an engaging slot 141 formed on a side of the panel 14 relative to the rotary mechanism 18. The accommodating slot structures 24 shown in FIG. 2 are the same as ones shown in FIG. 3, numerals may be omitted due to different views.

Figure 4:
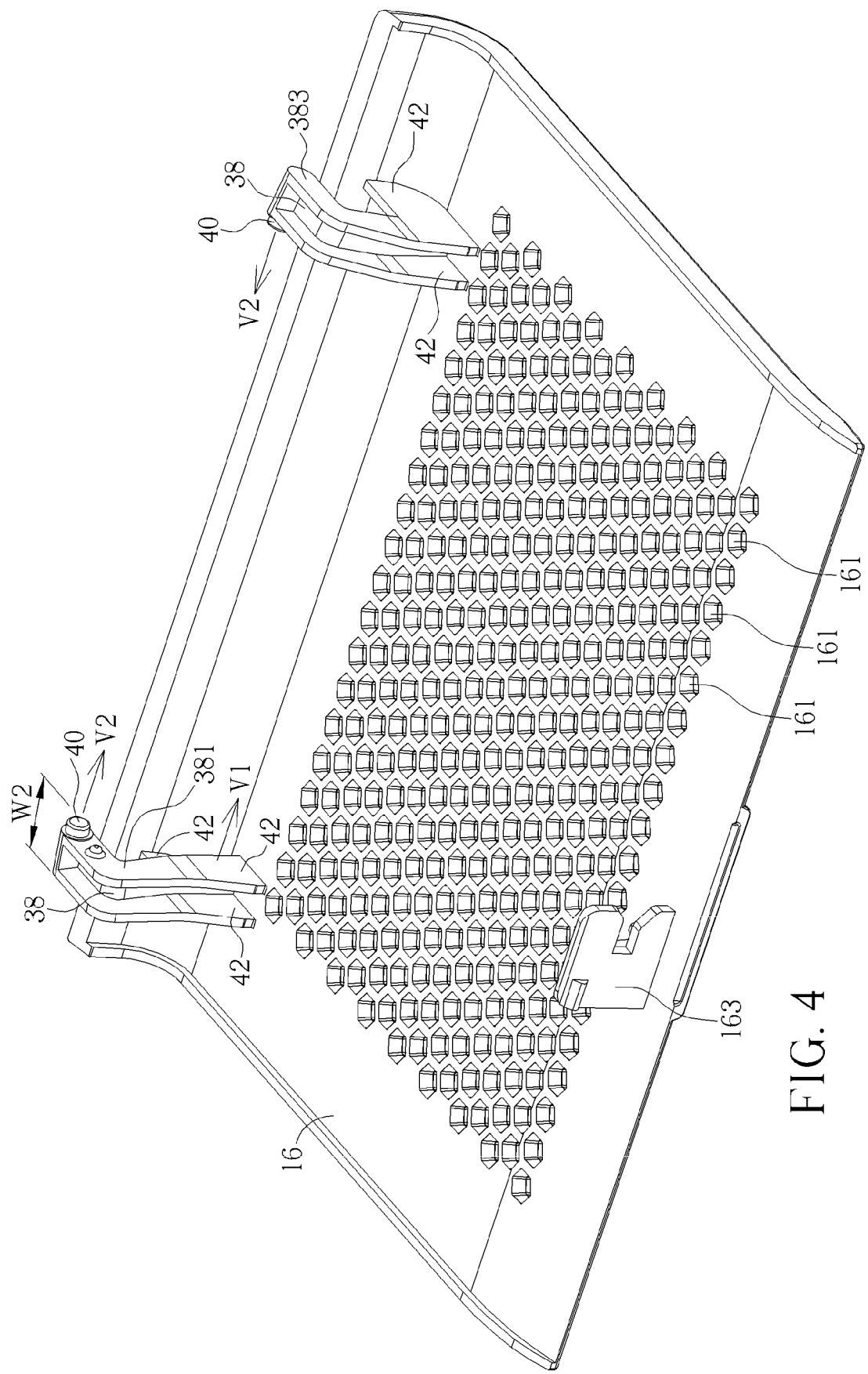
FIG. 4 is a diagram of a door according to the embodiment of the present invention.

Please refer to FIG. 1 to FIG. 4. FIG. 4 is a diagram of the door 16 according to the embodiment of the present invention. A plurality of ventilative holes 161 can be formed on a surface of the door 16 for dissipating heat generated from the electronic components 20. The door 16 can further include a hook 163 disposed on a side of the door 16 relative to the rotary mechanism 18. The hook 163 can be engaged with the engaging slot 141 to fix the door 16 on the panel 14. Each rotary mechanism 18 further includes a supporting arm 38 and a pivoting portion 40. The supporting arm 38 is disposed on the door 16 and located at the position relative to the hook 163. The supporting arm 38 includes a first surface 381 and a second surface 383, and the first surface 381 is opposite to the second surface 383. The pivoting portion 40 can be a solid structure or a hollow structure, which is disposed on the first surface 381 of the supporting arm 38. The pivoting portion 40 movably inserts into the pivot hole structure 34 of the accommodating slot structure 24, so that the supporting arm 38 can be rotatably disposed inside the accommodating slot structure 24.

In addition, as shown in FIG. 4, each rotary mechanism 18 can further include a plurality of ribs 42 connected between the supporting arm 38 and the door 16. Planar structure of the rib 42 can constrain a bend of the supporting arm 38 relative to the door 16 at a specific direction, and the supporting arm 38 can further be resiliently deformed relative to the door 16 at the other specific direction. For example, a planar normal vector V1 of the rib 42 can be substantially parallel to a pivot direction V2 of the pivoting portion 40. The rib 42 can effectively strengthen a combination of the supporting arm 38 and the door 16 at a direction perpendicular to the pivot direction V2, and the supporting arm 38 can be pressed to be resiliently deformed relative to the door 16 at the pivot direction V2. Shape of the rib 42 is not limited to ones shown in FIG. 4, and depends on design demand.

As shown in FIG. 2 to FIG. 4, each rotary mechanism 18 can further include a resilient component 44 movably disposed inside the opening structure 36. A first end 441 of the resilient component 44 can be connected to the second inner lateral wall 28 in a resiliently bending manner. The resilient component 44 stretches from the second inner lateral wall 28 obliquely into the accommodating slot structure 24, which means a second end 443 of the resilient component 44 relative to the first end 441 can point toward the accommodating slot structure 24. Therefore the first end 441 is a fix end, and the second end 443 is a free end. When the supporting arm 38 is disposed inside the accommodating slot structure 24, the second end 443 of the resilient component 44 points the second surface 383 of the supporting arm 38. The second end 443 does not contact the supporting arm 38 to avoid friction and to keep operation fluency of the rotary mechanism 18. It is to say, a distance W1 between the second end 443 and the first inner lateral wall 26 can be substantially smaller than an amount of widths of the supporting arm 38 and the pivoting portion 40, so the resilient component 44 can block the supporting arm 38 to prevent separation of the pivoting portion 40 and the pivot hole structure 34.

Figure 5:
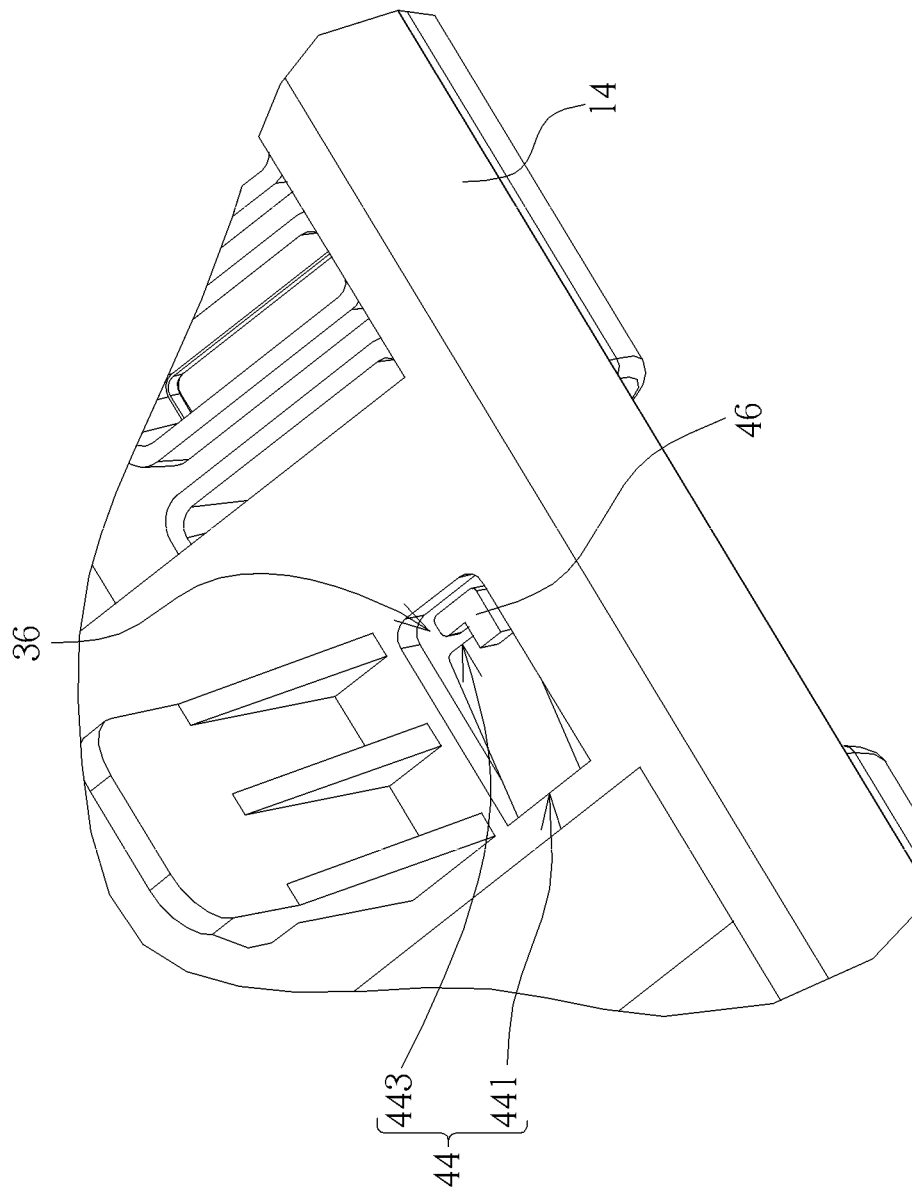
FIG. 5 is an enlarged diagram of the panel according to the embodiment of the present invention.
Figure 6:
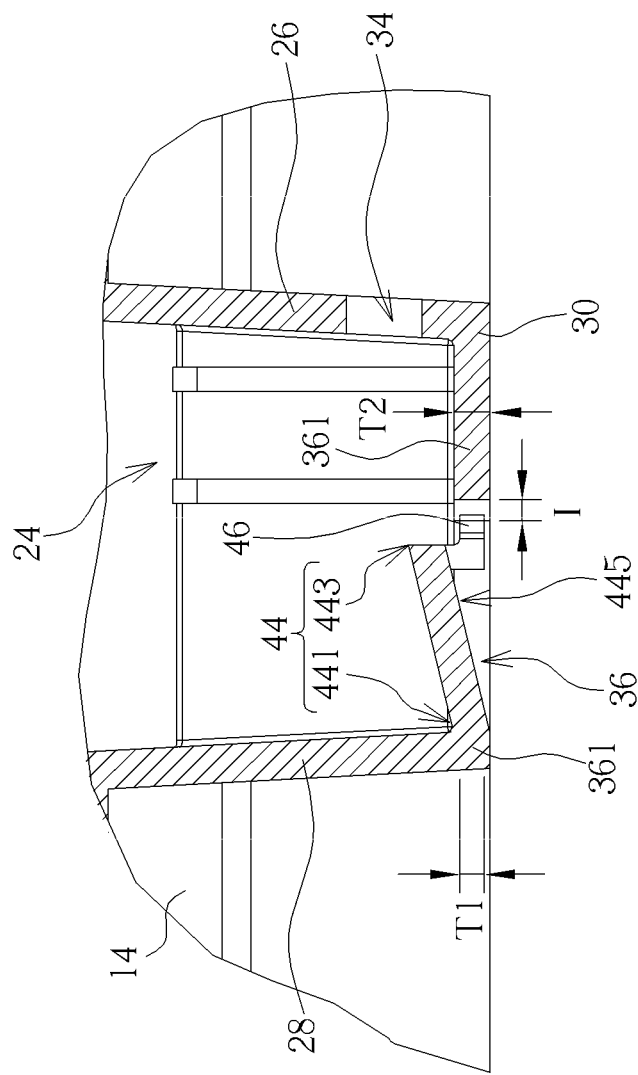
FIG. 6 is a sectional view of structures shown in FIG. 5.

Please refer to FIG. 5 and FIG. 6. FIG. 5 is an enlarged diagram of the panel 14 according to the embodiment of the present invention. FIG. 6 is a sectional view of structures shown in FIG. 5. Each rotary mechanism 18 can further include a handle 46 disposed on an outer surface 445 of the resilient component 44 and located at the second end 443. The handle 46 disposed on the outer surface 445 can be operated conveniently. The outer surface 445 is set between the walls 361 of the opening structure 36, which means that the resilient component 44 can slightly bend into the accommodating slot structure 24. Further, a thickness T1 of the handle 46 can be substantially smaller than a thickness T2 of the wall 361, so as to prevent the resilient component 44 from bending by components outside the accommodating slot structure or by the supporting arm 38 inside the accommodating slot structure 24 due to accident hit of the handle 46. As shown in FIG. 6, a gap I is formed between the handle 46 and the wall 361. The resilient component 44 and the handle 46 do not contact the wall 361, and the handle 46 can be pulled via the gap I to bend the resilient component 44.

Figure 7:
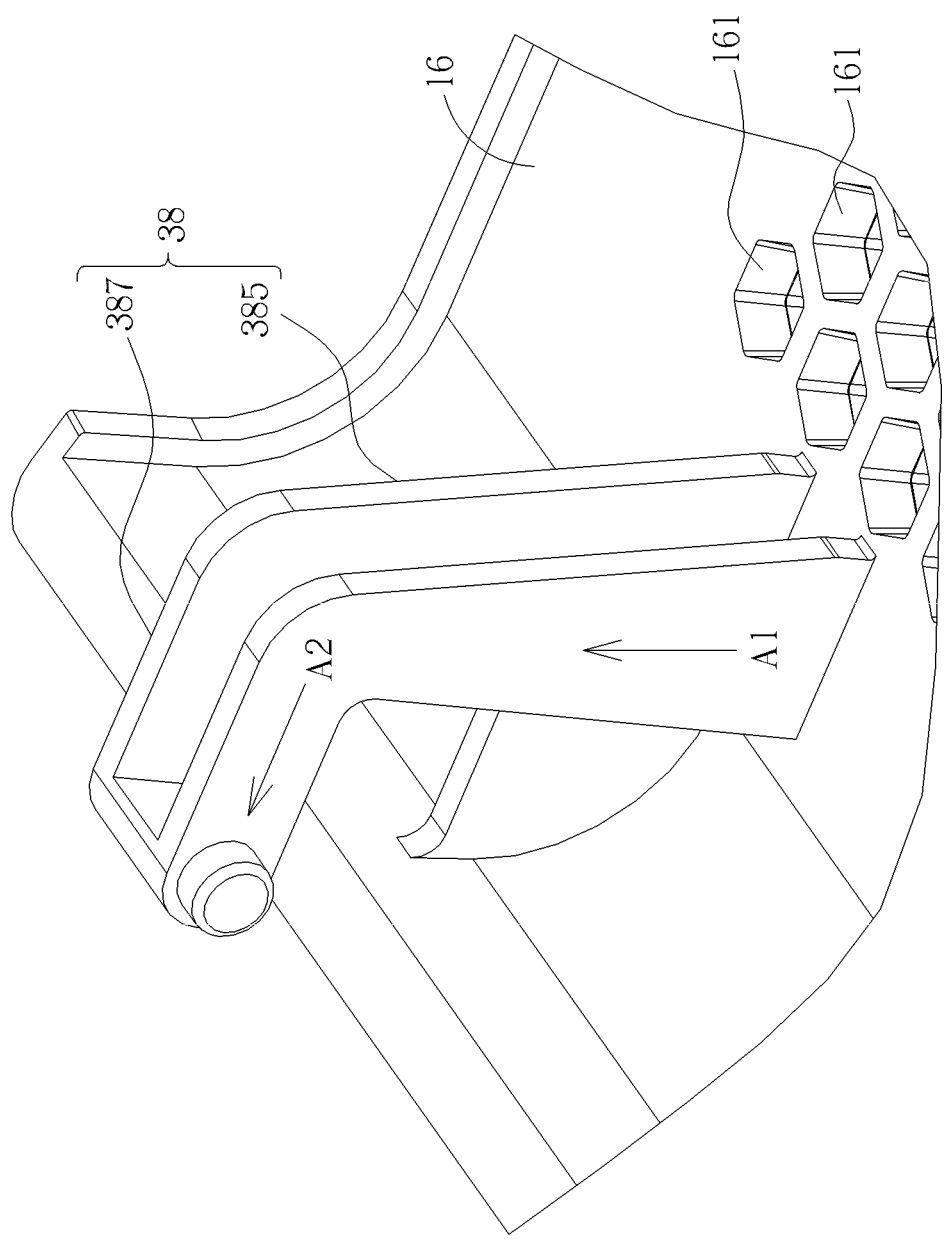
FIG. 7 is an enlarged diagram of structures shown in FIG. 4.

Please refer to FIG. 7. FIG. 7 is an enlarged diagram of structures shown in FIG. 4. The supporting arm 38 can include a first part 385 and a second part 387. The pivoting portion 40 is disposed on the second part 387, and the second part 387 can be the free end. Two ends of the first part 385 are respectively connected to the door 16 and the second part 387, and the first part 385 can be the fix end. A structural direction A1 of the first part 385 is different from a structural direction A2 of the second part 387. Generally, the first part 385 is perpendicularly connected to the second part 387 to form a L-shaped curved structure, so the supporting arm 38 can be accommodated inside the accommodating slot structure 24 when the door 16 covers the panel 14, and the supporting arm 38 can fully contact the constraining wall 32 of the accommodating slot structure 24 when the door 16 is unfolded relative to the panel 14 at the maximum angle, so as to reduce volume of the rotary mechanism 18 and to increase the operation fluency effectively.

Figure 8:
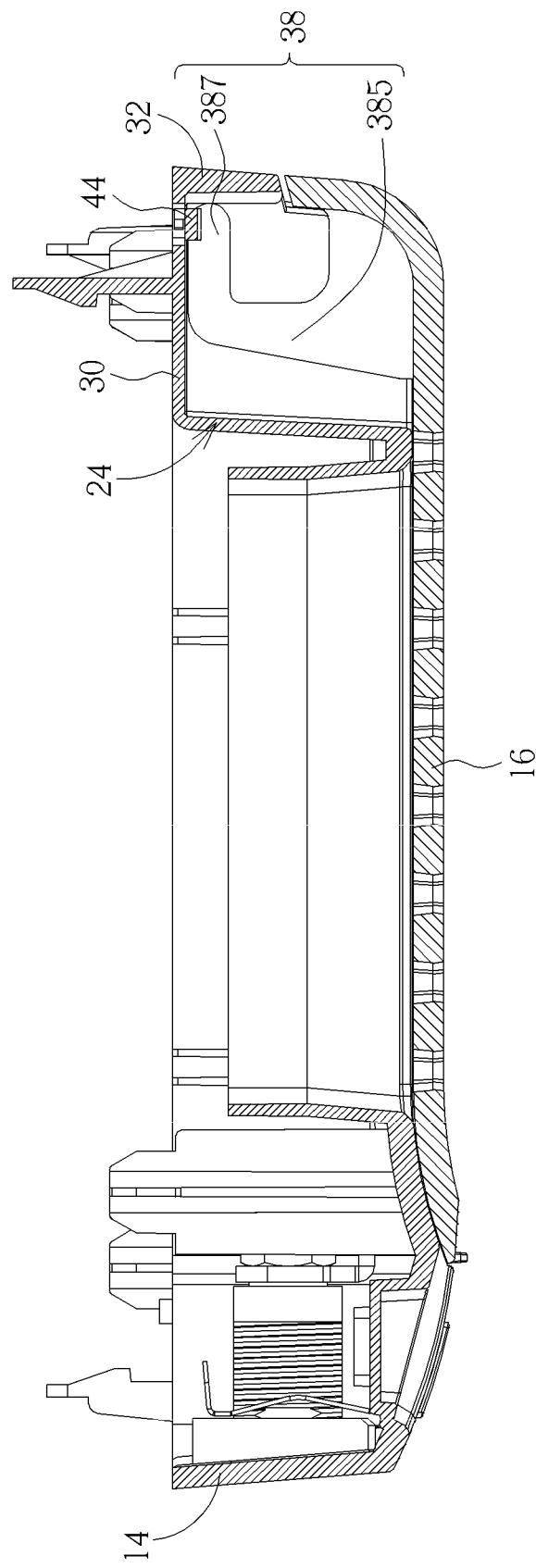
FIG. 8 to FIG. 10 respectively are diagrams of the door and the panel at different angles according to the embodiment of the present invention.
Figure 9:
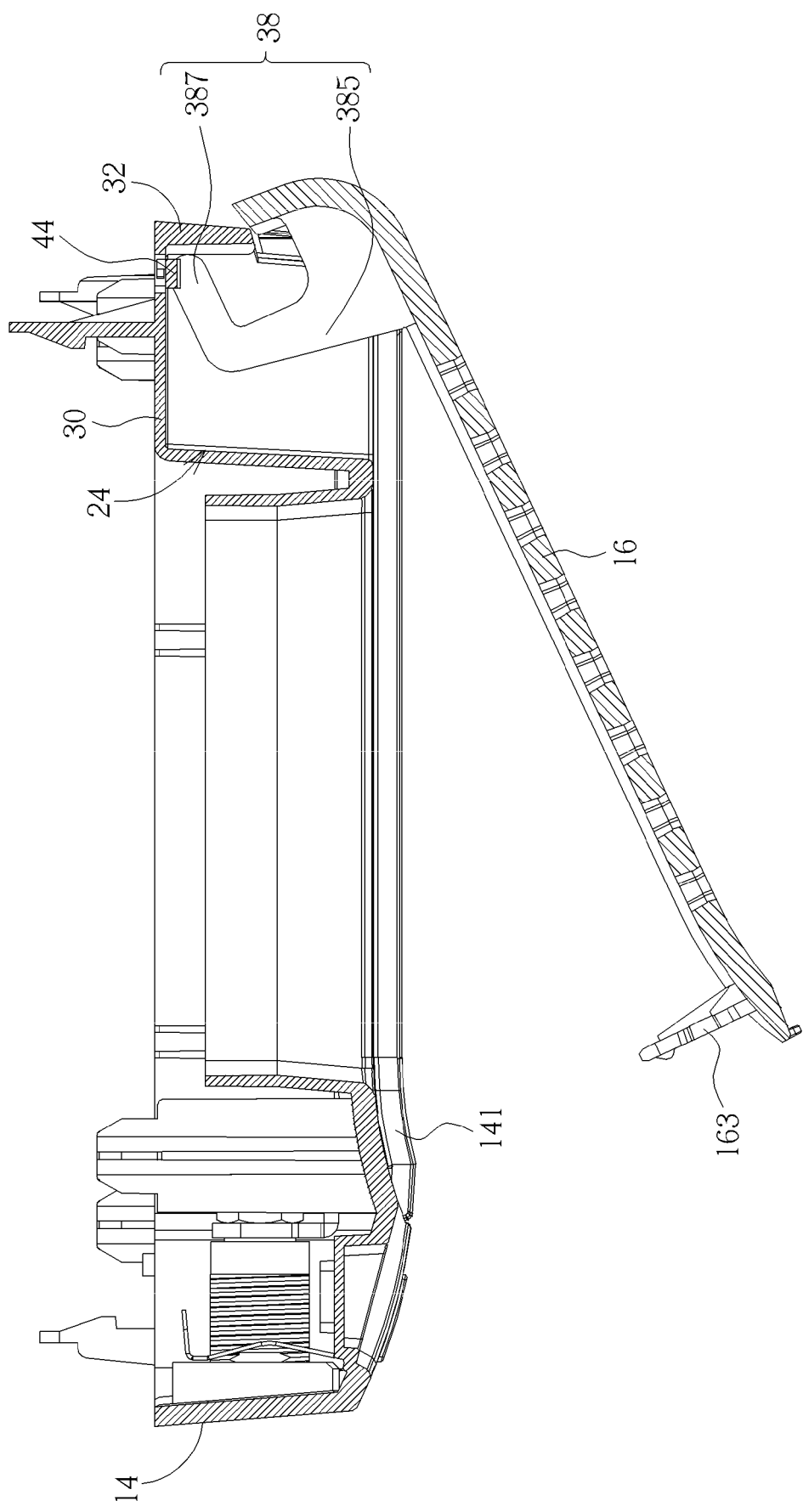
Figure 10:
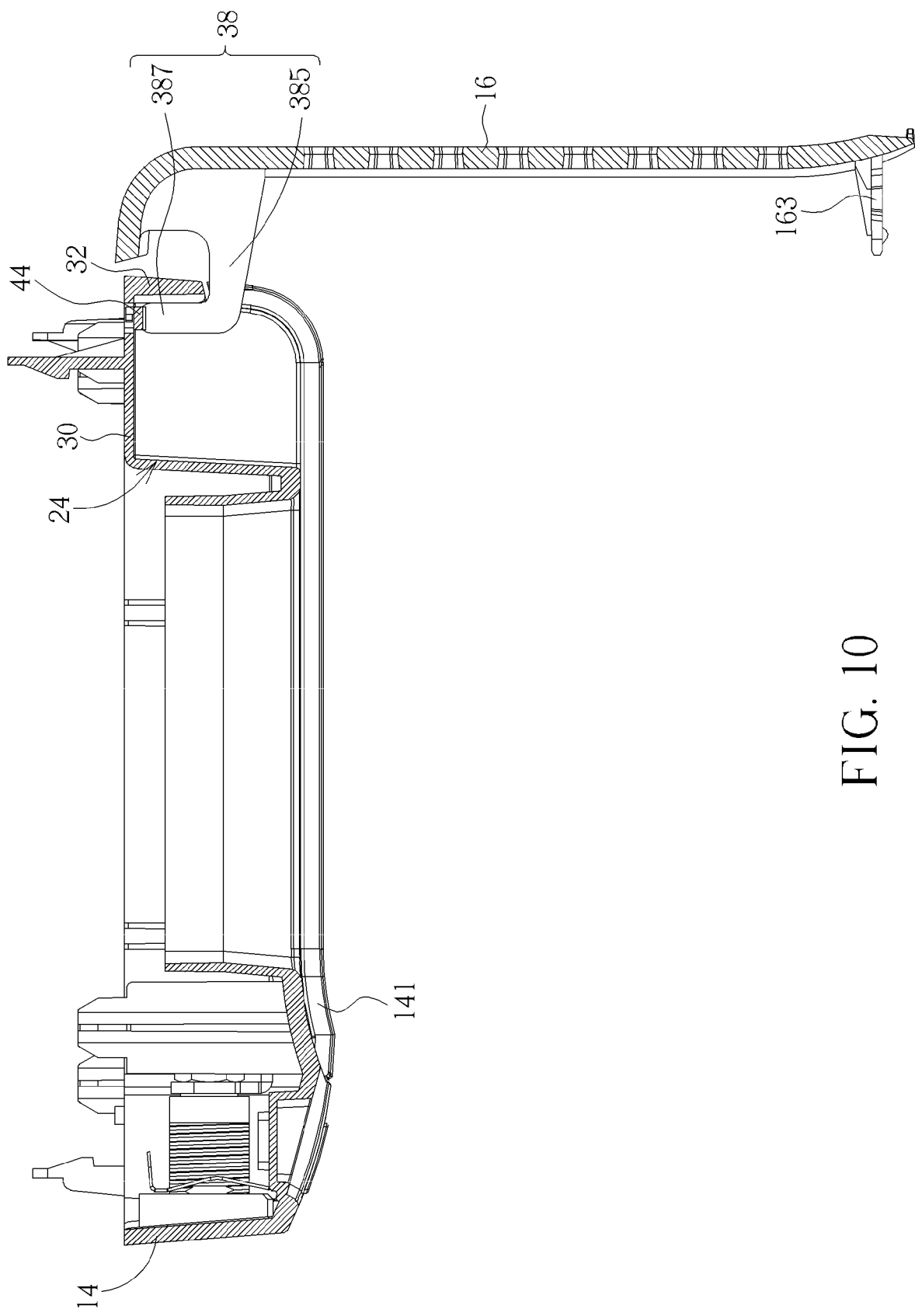

Please refer to FIG. 8 to FIG. 10. FIG. 8 to FIG. 10 respectively are diagrams of the door 16 and the panel 14 at different angles according to the embodiment of the present invention. As shown in FIG. 8, the second part 387 of the supporting arm 38 contacts the bottom 30 of the accommodating slot structure 24. The hook 163 is engaged with the engaging slot 141 (not shown in FIG. 8 to FIG. 10) to constrain rotation of the supporting arm 38 relative to the accommodating slot structure 24, so the door 16 can fully cover the panel 14. As shown in FIG. 9, the hook 163 is separated from the engaging portion 141. The supporting arm 38 can rotate relative to the accommodating slot structure 24 via the combination of the pivoting portion 40 and the pivot hole structure 34, the second part 387 of the supporting arm 38 is spaced from the bottom 30 of the accommodating slot structure 24. Final, as shown in FIG. 10, the door 16 rotates at the predetermined maximum angle. The second part 387 of the supporting arm 38 contacts against the constraining wall 32 of the accommodating slot structure 24, and the door 16 can not rotate relative to the panel 14. Thus, structural variation of the supporting arm 38 (the angle between the structural direction A1 and the structural direction A2) can substantially correspond to the maximum angle between the door 16 and the panel 14.

Figure 11:
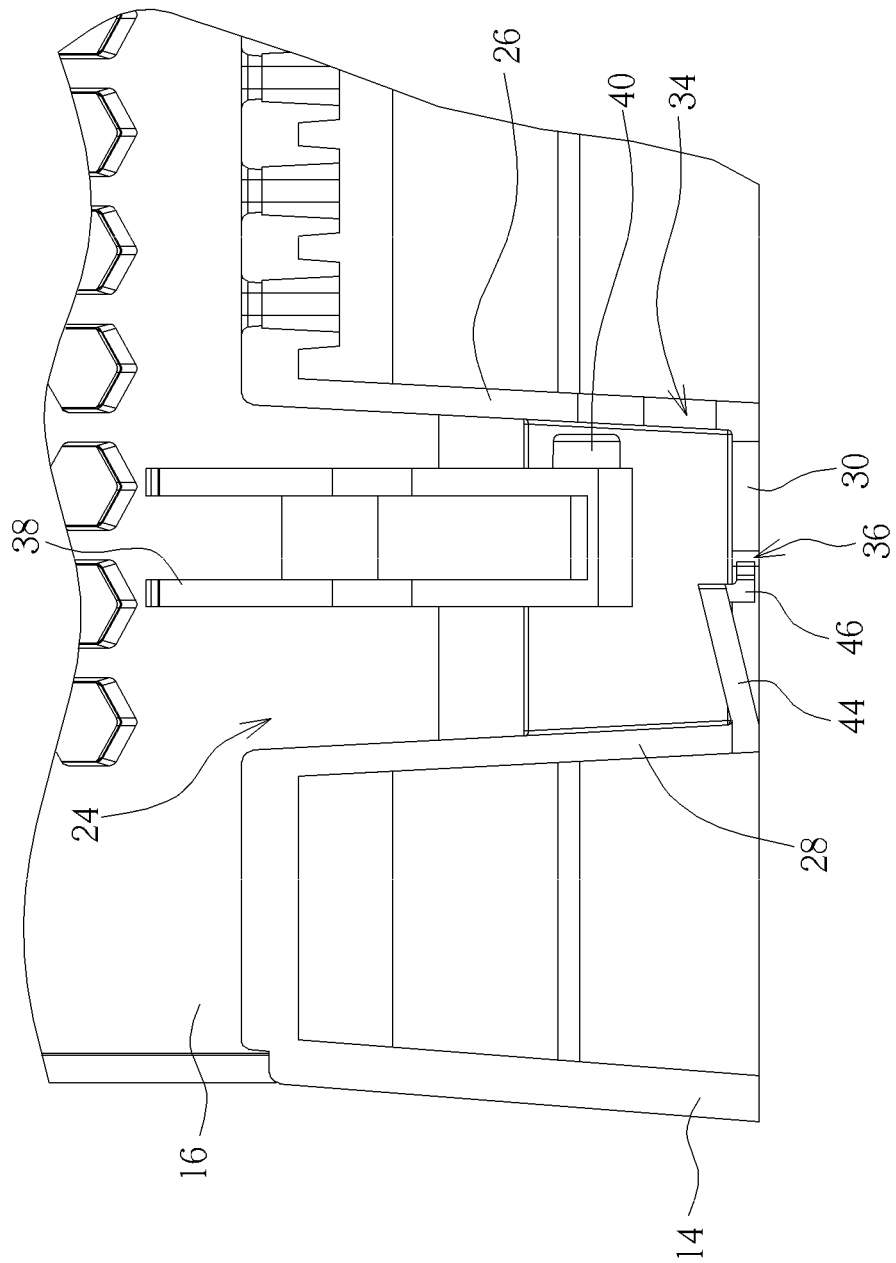
FIG. 11 to FIG. 14 respectively are diagrams of the electronic device in different assembly procedures according to the embodiment of the present invention.
Figure 12:
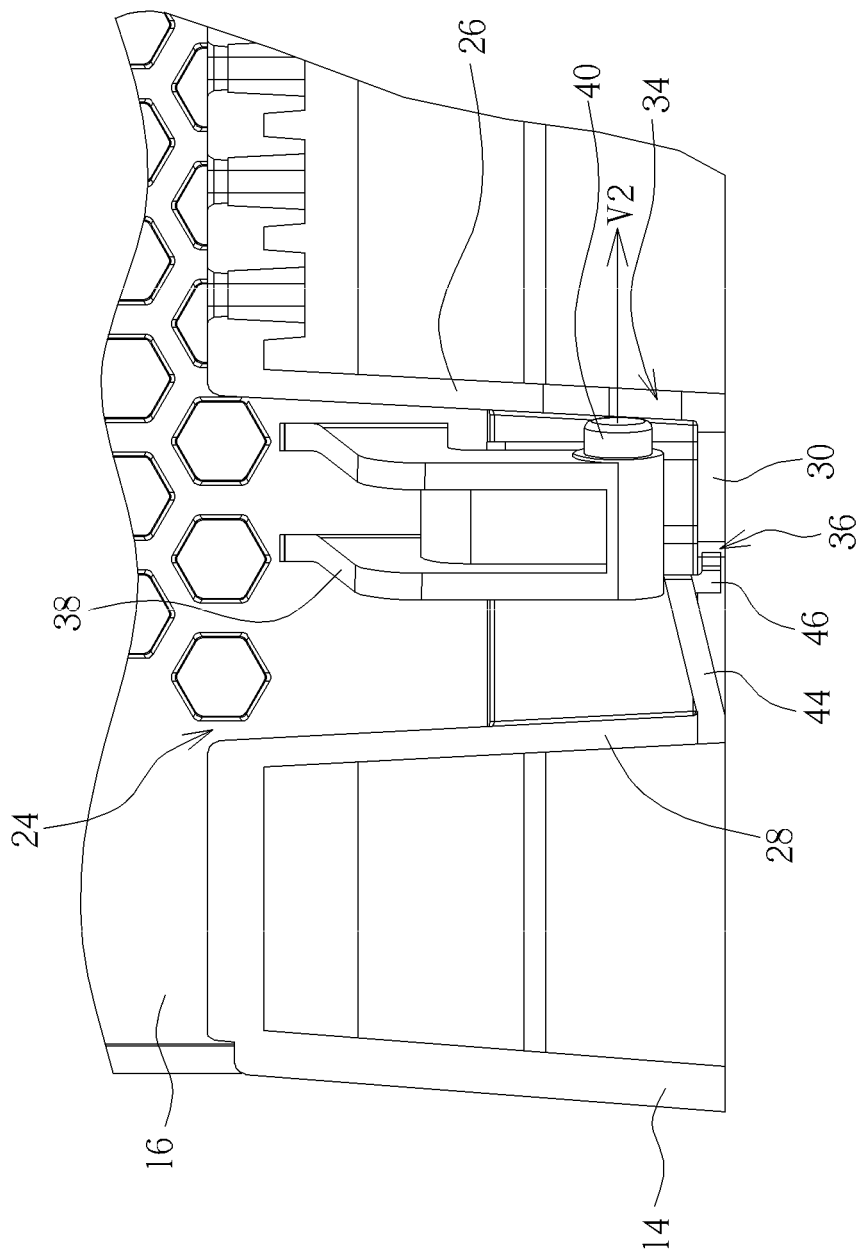

Please refer to FIG. 11 to FIG. 14. FIG. 11 to FIG. 14 respectively are diagrams of the electronic device 10 in different assembly procedures according to the embodiment of the present invention. As shown in FIG. 11, the supporting arm 38 is at an initial mode when the pivoting portion 40 does not insert into the pivot hole structure 34. The supporting arm 38 does not resiliently bend relative to the door 16. Then, as shown in FIG. 12, the supporting arm 38 gradually inserts into the accommodating slot structure 24 for assembly of the door 16 and the panel 14. In the meantime the supporting arm 38 can downwardly press the resilient component 44. The supporting arm 38 can be bent manually to prevent structural interference of the pivoting portion 40 and the first inner lateral wall 26. Further, the pivoting portion 40 can be forced to contact the first inner lateral wall 26 and moves toward the pivot hole structure 34. The supporting arm 38 can be resiliently deformed relative to the door 16 at the direction opposite to the pivot direction V2 because the pivoting portion 40 contacts the first inner lateral wall 26 by the external force, so as to overcome the structural interference of the pivoting portion 40 and the first inner lateral wall 26.

Figure 13:
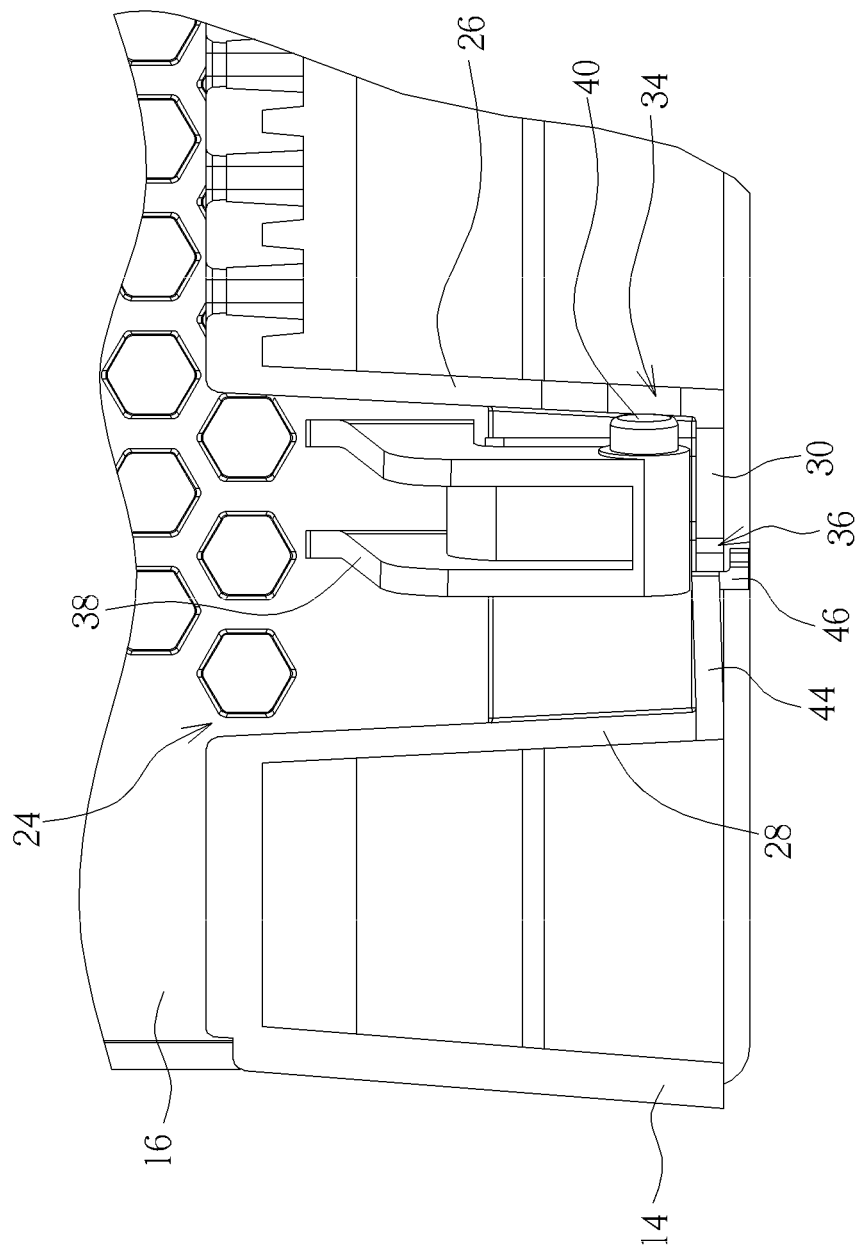
Figure 14:
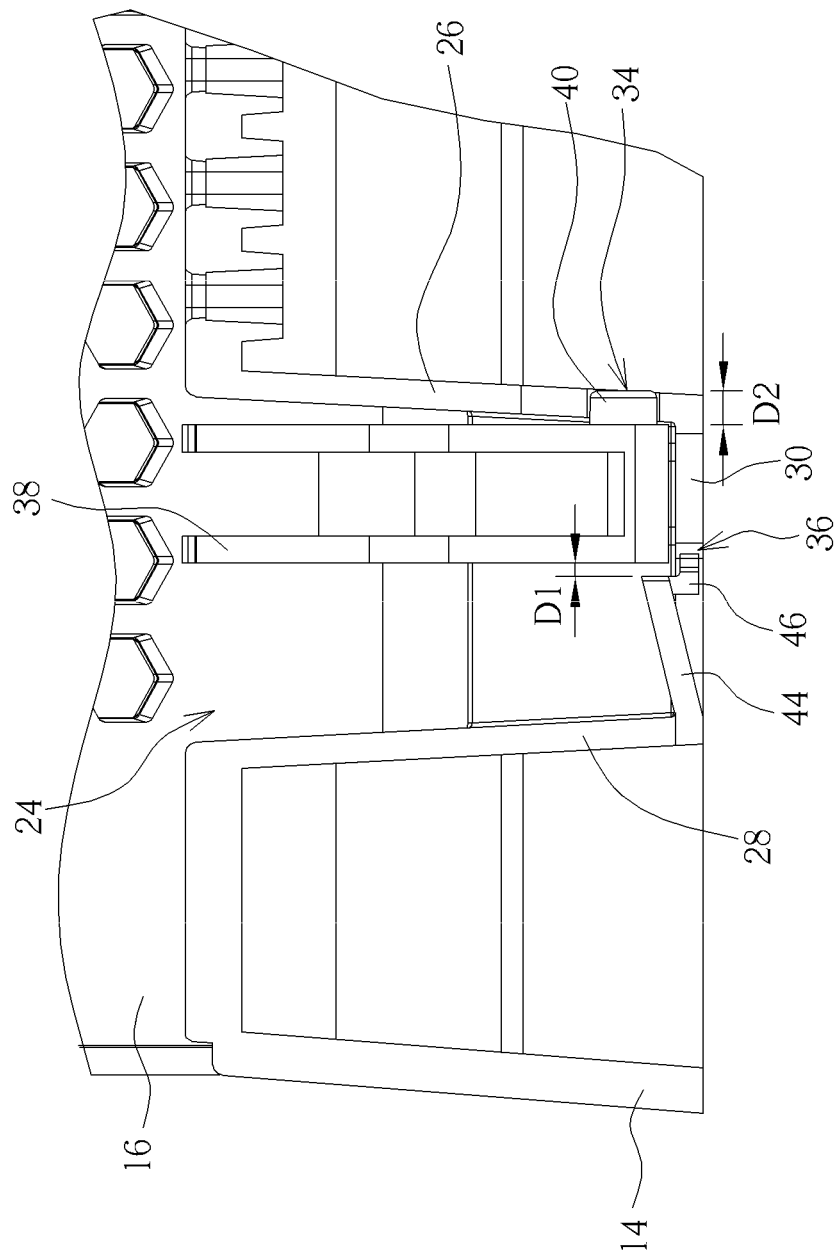

As shown in FIG. 13, the resilient component 44 can be deformed by the supporting arm 38 to be parallel to the bottom 30 when the supporting arm 38 moves to bottom of the accommodating slot structure 24 and the pivoting portion 40 aligns with the pivot hole structure 30. Meanwhile, the pivoting portion 40 is separated from the first inner lateral wall 26, and the supporting arm 38 can back to the initial angle shown in FIG. 11 by the resilient recovering force. Final, as shown in FIG. 14, the pivoting portion 40 inserts into the pivot hole structure 34 via the resilient recovering force of the supporting arm 38. Pressure applied to the resilient component 44 by the supporting arm 38 is removed, so the resilient component 44 can back to the initial mode shown in FIG. 11 by the resilient recovering force. The resilient component 44 does not contact the supporting arm 38. The resilient component 44 can block the supporting arm 38 when the pivoting portion 40 moves out of the pivot hole structure 34, so as to prevent the complete separation of the pivoting portion 40 and the pivot hole structure 34. Therefore, a distance D1 between the resilient component 44 and the supporting arm 38 can be substantially smaller than a depth D2 of the pivot hole structure 34 where into the pivoting portion 40 inserts.

In conclusion, the rotary mechanism of the present invention can integrate the supporting arm with the door monolithically. The door, the supporting arm and the pivoting portion can be combined with each other by the injection molding technology, so the supporting arm can be resiliently deformed. For assembly of the pivoting portion and the pivot hole structure, the supporting arm can be manually pulled to be bent relative to the door, or the supporting arm can contact the wall of the accommodating slot structure to be bent by reacting force. The rib is not parallel to the pivot direction to keep stable flexibility of the supporting arm relative to the door.

In addition, the resilient component of the rotary mechanism can be integrated with the panel monolithically. The panel, the accommodating slot structure, the resilient component and the handle can be combined with each other by the injection molding technology. The resilient component can slightly raise relative to the bottom of the accommodating slot structure, so as to block the supporting arm when the pivoting portion moves relative to the pivot hole structure for preventing separation of the pivoting portion and the pivot hole structure. Assembly procedures of the electronic device mentioned as above are omitted herein for simplicity. The handle can be manually pulled to substantially parallel to the bottom of the accommodating slot structure, constraint of the handle for the supporting arm is released, and the pivoting portion can move out of the pivot hole structure with the movement of the supporting arm for rapid separation of the door and the panel.

Comparing to the prior art, the rotary mechanism of the present invention has advantages of simple structure, easy manufacture and low cost. The resilient recovering force of the supporting arm and the resilient component can be utilized to rapidly assemble the door with the panel, and the resilient component further can prevent separation of the door and the panel. Disassembly of the door from the panel is tooless, and constraint of the rotary mechanism between the door and the panel can be released manually. The rotary mechanism of the present invention conforms to safety regulation of the consumer apparatus market, which is set according to material property of the rotary mechanism. Therefore, the electronic device with the rotary mechanism of the present invention has advantages of easy operation, artistic appearance and preferred structural strength.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A rotary mechanism disposed between a door and a panel, the rotary mechanism comprising:
   an accommodating slot structure disposed on the panel, the accommodating slot structure comprising a first inner lateral wall, a second inner lateral wall and a bottom, the first inner lateral wall and the second inner lateral wall being opposite lateral walls, the accommodating slot structure comprising:
      a pivot hole structure formed on the first inner lateral wall; and
      an opening structure formed on the bottom and adjacent to the second inner lateral wall;
   a supporting arm disposed on the door, the supporting arm comprising a first surface and a second surface, the first surface being opposite to the second surface;
   a pivoting portion disposed on the first surface of the supporting arm, the pivoting portion inserting into the pivot hole structure so that the supporting arm is rotatably disposed inside the accommodating slot structure; and
   a resilient component movably disposed inside the opening structure, a first end of the resilient component being connected to the second inner lateral wall in a resiliently bending manner, a second end of the resilient component relative to the first end pointing the second surface of the supporting arm to prevent separation of the pivoting portion and the pivot hole structure.

2. The rotary mechanism of claim 1, wherein a distance between the first inner lateral wall and the second end of the resilient component is substantially smaller than an amount of widths of the supporting arm and the pivoting portion.

3. The rotary mechanism of claim 1, further comprising:
   a handle disposed on the second end of the resilient component and located at an outer surface of the resilient component.

4. The rotary mechanism of claim 3, wherein the resilient component stretches from the second inner lateral wall into the accommodating slot structure, and the outer surface of the resilient component is located between walls of the opening structure.

5. The rotary mechanism of claim 3, wherein a thickness of the handle is substantially smaller than a wall thickness of the opening structure.

6. The rotary mechanism of claim 3, wherein a gap is formed between the handle and a wall of the opening structure.

7. The rotary mechanism of claim 1, further comprising:
   at least one rib connected between the supporting arm and the door, a planar normal vector of the rib being substantially parallel to a pivot direction of the pivoting portion.

8. The rotary mechanism of claim 1, wherein the pivoting portion is a solid structure or a hollow structure.

9. The rotary mechanism of claim 1, wherein the supporting arm comprises a first part and a second part, two ends of the first part are respectively connected to the door and the second part, a structural direction of the first part is different from a structural direction of the second part.

10. The rotary mechanism of claim 9, wherein the accommodating slot structure further comprises a constraining wall, the second part of the supporting arm contacts against the bottom and the constraining wall to constrain rotation of the supporting arm relative to the accommodating slot structure.

11. An electronic device comprising:
    a casing where inside an electronic component is disposed;
    a panel disposed on the casing, a hole being formed on the panel, and the electronic component being partly exposed via the hole; and
    a door rotatably disposed on the panel for covering the electronic component; and
    at least one rotary mechanism disposed between the door and the panel, the rotary mechanism comprising:
       an accommodating slot structure disposed on the panel, the accommodating slot structure comprising a first inner lateral wall, a second inner lateral wall and a bottom, the first inner lateral wall and the second inner lateral wall being opposite lateral walls, the accommodating slot structure comprising:
          a pivot hole structure formed on the first inner lateral wall; and
          an opening structure formed on the bottom and adjacent to the second inner lateral wall;
       a supporting arm disposed on the door, the supporting arm comprising a first surface and a second surface, the first surface being opposite to the second surface;
       a pivoting portion disposed on the first surface of the supporting arm, the pivoting portion inserting into the pivot hole structure so that the supporting arm is rotatably disposed inside the accommodating slot structure; and
       a resilient component movably disposed inside the opening structure, a first end of the resilient component being connected to the second inner lateral wall in a resiliently bending manner, a second end of the resilient component relative to the first end pointing the second surface of the supporting arm to prevent separation of the pivoting portion and the pivot hole structure.

12. The electronic device of claim 11, wherein a distance between the first inner lateral wall and the second end of the resilient component is substantially smaller than an amount of widths of the supporting arm and the pivoting portion.

13. The electronic device of claim 11, wherein the rotary mechanism further comprises:
    a handle disposed on the second end of the resilient component and located at an outer surface of the resilient component.

14. The electronic device of claim 13, wherein the resilient component stretches from the second inner lateral wall into the accommodating slot structure, and the outer surface of the resilient component is located between walls of the opening structure.

15. The electronic device of claim 13, wherein a thickness of the handle is substantially smaller than a wall thickness of the opening structure, and a gap is formed between the handle and a wall of the opening structure.

16. The electronic device of claim 11, wherein the rotary mechanism further comprises:
   at least one rib connected between the supporting arm and the door, a planar normal vector of the rib being substantially parallel to a pivot direction of the pivoting portion.

17. The electronic device of claim 11, wherein the supporting arm comprises a first part and a second part, two ends of the first part are respectively connected to the door and the second part, a structural direction of the first part is different from a structural direction of the second part.

18. The electronic device of claim 17, wherein the accommodating slot structure further comprises a constraining wall, the second part of the supporting arm contacts against the bottom and the constraining wall to constrain rotation of the supporting arm relative to the accommodating slot structure.

* * * * *